(12) United States Patent
Lin et al.

(10) Patent No.: US 10,791,643 B1
(45) Date of Patent: Sep. 29, 2020

(54) BUTTON ASSEMBLY

(71) Applicant: Cheng Uei Precision Industry Co., LTD., New Taipei (TW)

(72) Inventors: Chih-Chiang Lin, New Taipei (TW); Te-Hung Yin, New Taipei (TW); Chun-Fu Lin, New Taipei (TW); Sheng-Nan Yu, New Taipei (TW)

(73) Assignee: CHENG UEI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/733,178

(22) Filed: Jan. 2, 2020

(30) Foreign Application Priority Data

May 15, 2019 (CN) .................... 2019 2 0695335 U

(51) Int. Cl.
| | |
|---|---|
| *H01R 13/62* | (2006.01) |
| *H05K 5/02* | (2006.01) |
| *H01R 13/629* | (2006.01) |
| *H04B 1/3816* | (2015.01) |

(52) U.S. Cl.
CPC .......... *H05K 5/0256* (2013.01); *H01R 13/629* (2013.01); *H05K 5/023* (2013.01); *H04B 1/3816* (2013.01)

(58) Field of Classification Search
CPC .. G06K 13/08; G06K 13/0806; G06K 13/633; H01R 23/7005; H01R 13/62938; H01R 13/62955; H01R 13/62933

USPC ........................................ 439/159, 160, 372
See application file for complete search history.

(56) References Cited

U.S. PATENT DOCUMENTS

| | | | | |
|---|---|---|---|---|
| 10,651,600 B1* | 5/2020 | Lin | ...................... | H01R 12/712 |
| 2004/0235325 A1* | 11/2004 | Iijima | .................. | G06K 7/0013 |
| | | | | 439/159 |
| 2007/0141878 A1* | 6/2007 | Van der Steen | ....... | G06K 13/08 |
| | | | | 439/159 |
| 2009/0267677 A1* | 10/2009 | Myers | .................. | H04B 1/3818 |
| | | | | 327/356 |
| 2012/0276764 A1* | 11/2012 | Nakase | ............. | G06K 13/0831 |
| | | | | 439/159 |

* cited by examiner

*Primary Examiner* — Phuong Chi Thi Nguyen
(74) *Attorney, Agent, or Firm* — Cheng-Ju Chiang

(57) ABSTRACT

A button assembly of the present invention is configured in a communication equipment, characterized in that: the button assembly includes a button, a tray and at least an elastic arm. A surface of the button is recessed to form a holding groove. The tray is disposed with a locking hole and a locking groove. The elastic arm has a pedestal arranged in the holding groove. The pedestal is protruded outward to form an elastic bar. A free end of the elastic bar forms a bump corresponding to the locking hole. An outer edge of the free end of the elastic bar forms a locking block corresponding to the locking groove. Hence, the locking hole and the elastic arm are disposed to provide the button and the tray to be fixed or disengaged, so as to achieve an effect of saving space in assembling of internal components of the communication equipment.

4 Claims, 8 Drawing Sheets

BUTTON ASSEMBLY

BACKGROUND OF THE INVENTION

1. Field of the Invention

The present application is based on, and claims priority from, China application number 201920695335.8, filed May 15, 2019, the disclosure of which is hereby incorporated by reference herein in its entirety. The present invention generally relates to a button assembly, and more particularly to a button assembly capable of saving space in assembling of internal components of communication equipment.

2. Related Art

With the development of technology, in order to make communication equipment more functional and powerful, more new components are needed to be assembled in the communication equipment. Because of a requirement of being comfortable to touch in use, it is difficult to adjust the size of the communication equipment. Therefore, adjusting volume or configuration of internal components of the communication equipment is necessary.

However, Subscriber Identity Module (SIM) used for storage of user identification information, message information and phone number has been involved in the communication equipment. Because of the configuration of SIM card chip, the size of SIM card cannot be further reduced, so there is a need to combine a SIM card slot with the internal components of the communication equipment to save space for assembly of more new components to allow the communication equipment to carry more renewal functions.

Therefore, it is necessary to provide a button assembly which provides combining of a volume button and a SIM card slot to save space in assembling of the internal components of the communication equipment.

SUMMARY OF THE INVENTION

An object of the present invention is to provide a modularized button assembly to overcome the flaws and insufficiency of the conventional button structure.

To attain this, a button assembly of the present invention is configured in a communication equipment, characterized in that: the button assembly includes a button, a tray and at least an elastic arm. A surface of the button is recessed to form a holding groove. The tray is combined with the button and is disposed with a locking hole. The locking hole has a locking groove. The locking groove is formed in a recess of the locking hole. The elastic arm is assembled on the button and has a pedestal arranged in the holding groove. The pedestal is protruded outward to form an elastic bar. A free end of the elastic bar forms a bump arranged corresponding to the locking hole. An outer edge of the free end of the elastic bar forms a locking block arranged corresponding to the locking groove. When the bump is mounted in the locking hole, the locking block is abutted against the locking groove. When the button assembly is configured in the communication equipment, the bump is push downward to make the locking block disengaged from the locking groove to loosen the tray from the button.

Accordingly, a side of the button is recessed inward to form a holding space, a side of the tray is protruded to form a base, the base is disposed in the holding space.

Accordingly, a surface of the button has at least a first positioning opening communicated with the holding space, the holding groove has at least a second positioning opening penetrating through and connecting to the holding space, the second positioning opening is arranged corresponding to the first positioning opening, the base has at least a third positioning opening arranged corresponding to the first positioning opening.

Accordingly, the first positioning opening is recessed to form an upper limit groove, the button assembly further includes at least a fixing member, the fixing member is disposed corresponding to the first positioning opening, an end of the fixing member has a fixing cap, the fixing member penetrates the first positioning opening, the third positioning opening and the second positioning opening, the fixing cap of the fixing member are placed in the upper limit groove, the pedestal is contacted with the fixing member and is fixed with the fixing member by means of spot welding or riveting pressure.

As above, the locking hole and the elastic arm are disposed to form the button assembly which provides the button and the tray are fixed or disengaged. The button and the tray are fixed to each other before configured in the communication equipment and are disengaged from each other after configured in the communication equipment. When the user presses the button for adjusting volume, the button is displaced and the tray can avoid being influenced by a rotational displacement of the button and can keep a fixed position in the communication equipment. Therefore, a combination of the button and the tray achieves an effect of saving space in assembling of internal components of the communication equipment.

DESCRIPTION OF THE PREFERRED EMBODIMENTS

In order to describe the technical contents, structural features, purpose to be achieved and the effectiveness of the present invention, the detailed description is given with schema below.

Figure 1:
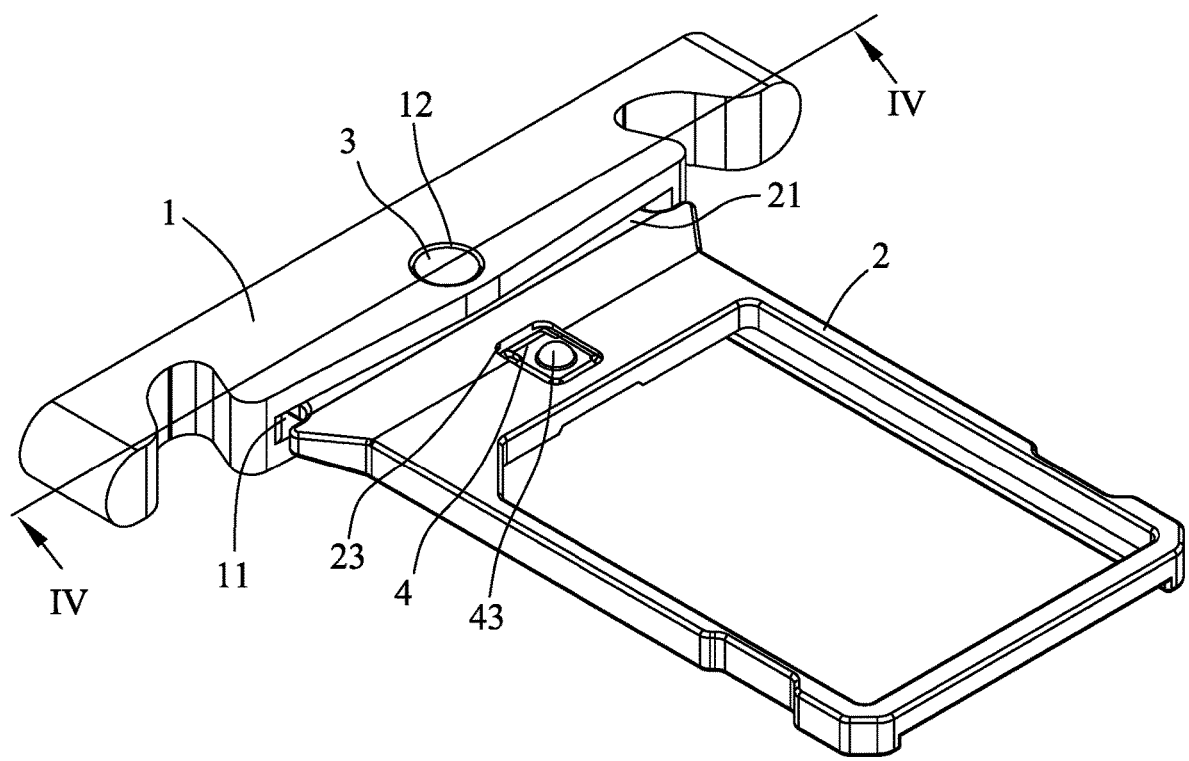
FIG. 1 is a perspective view of button assembly in accordance with the present invention.
Figure 2:
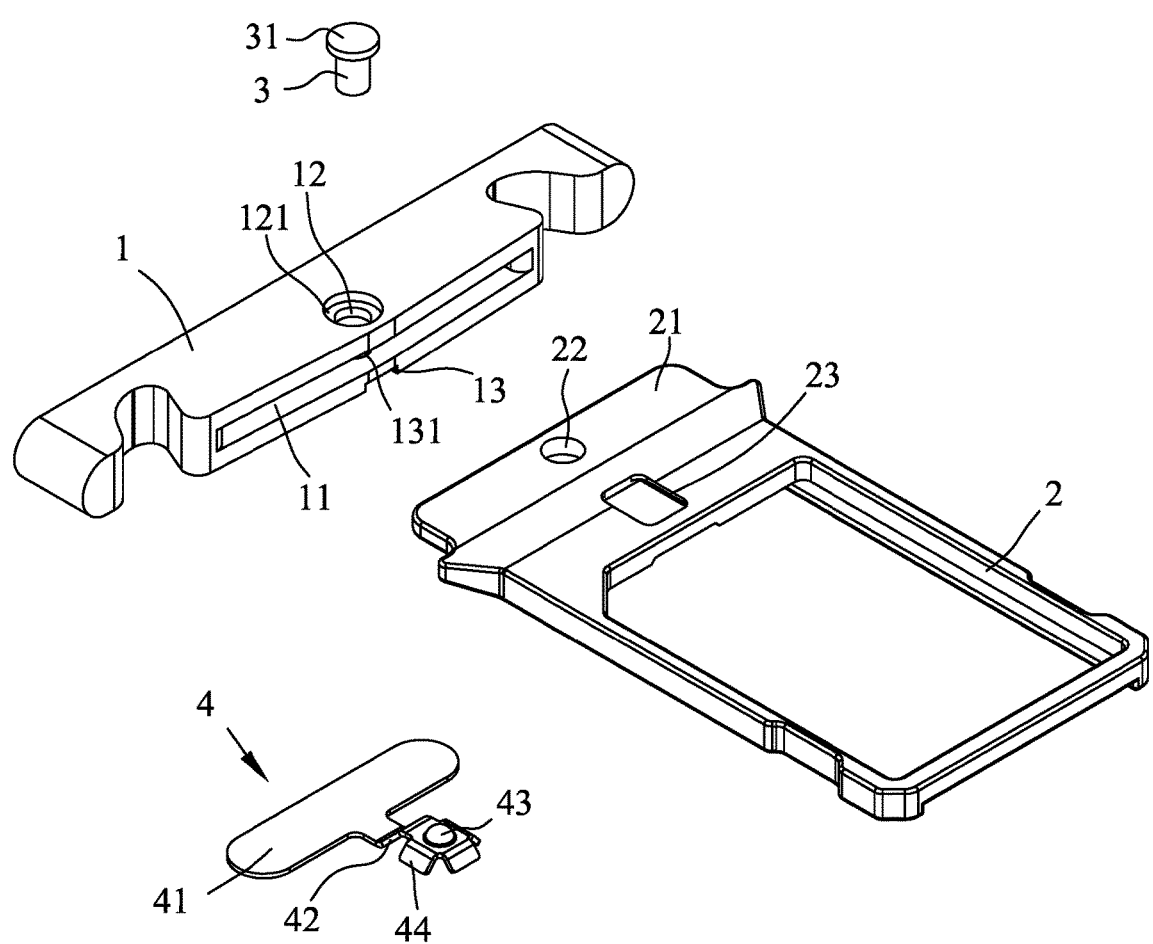
FIG. 2 is an exploded perspective view of FIG. 1.
Figure 3:
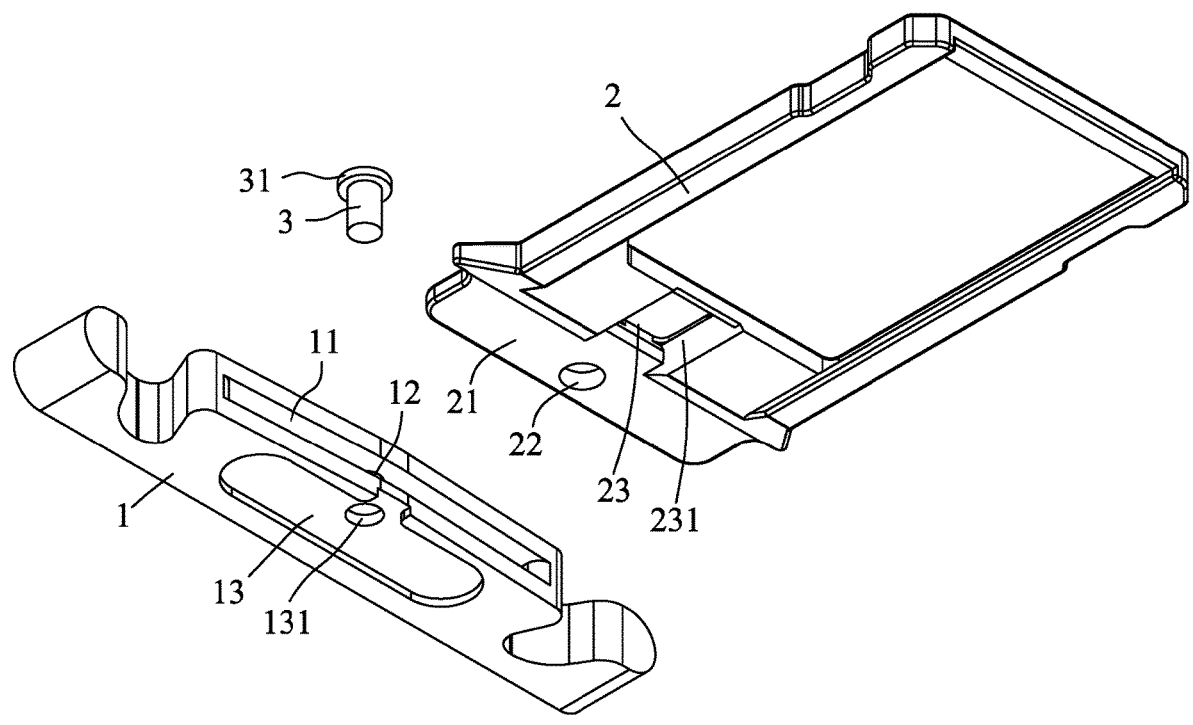
FIG. 3 is an exploded perspective view of FIG. 1 at a different view angle.
Figure 3:
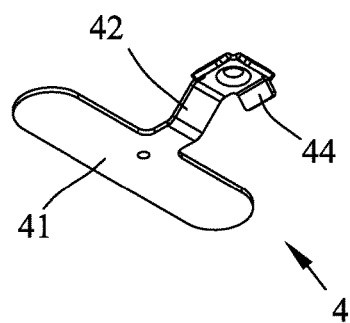

Referring to FIG. 1 through FIG. 3, a button assembly 100 in accordance with the present invention includes a button 1, a tray 2, at least a fixing member 3 and at least an elastic arm 4. A side of the button 1 is recessed inward to form a holding space 11. A surface of the button 1 has at least a first positioning opening 12 communicated with the holding space 11. The first positioning opening 12 is recessed to form an upper limit groove 121. An another surface of the button 1 is recessed to form a holding groove 13. The holding groove 13 has at least a second positioning opening 131 penetrating through and connecting to the holding space 11. The second positioning opening 131 is arranged corresponding to the first positioning opening 12.

A side of the tray 2 is protruded to form a base 21. The base 21 is disposed in the holding space 11. The base 21 has at least a third positioning opening 22 arranged corresponding to the first positioning opening 12. The tray 2 is disposed with a locking hole 23. The locking hole 23 has a locking groove 231. The locking groove 231 is formed as a slant in a recess of the locking hole 23.

The fixing member 3 is disposed corresponding to the first positioning opening 12. An end of the fixing member 3 has a fixing cap 31. The fixing member 3 penetrates the first positioning opening 12, the third positioning opening 22 and the second positioning opening 131. The fixing cap 31 of the fixing member 3 are placed in the upper limit groove 121.

The elastic arm 4 is disposed corresponding to the holding groove 13. The elastic arm 4 has a pedestal 41. The pedestal 41 is arranged in the holding groove 13. The pedestal 41 is contacted with the fixing member 3 and is fixed with the fixing member 3 by means of spot welding or riveting pressure. The pedestal 41 is protruded outward to form an elastic bar 42. A free end of the elastic bar 42 forms a bump 43. The bump 43 is arranged corresponding to the locking hole 23. An outer edge of the free end of the elastic bar 42 forms a locking block 44. The locking block 44 is arranged corresponding to the locking groove 231. When the bump 43 is mounted in the locking hole 23, the locking block 44 is abutted against the locking groove 231 so that the button 1 and the tray 2 are fixed with each other.

Figure 5:
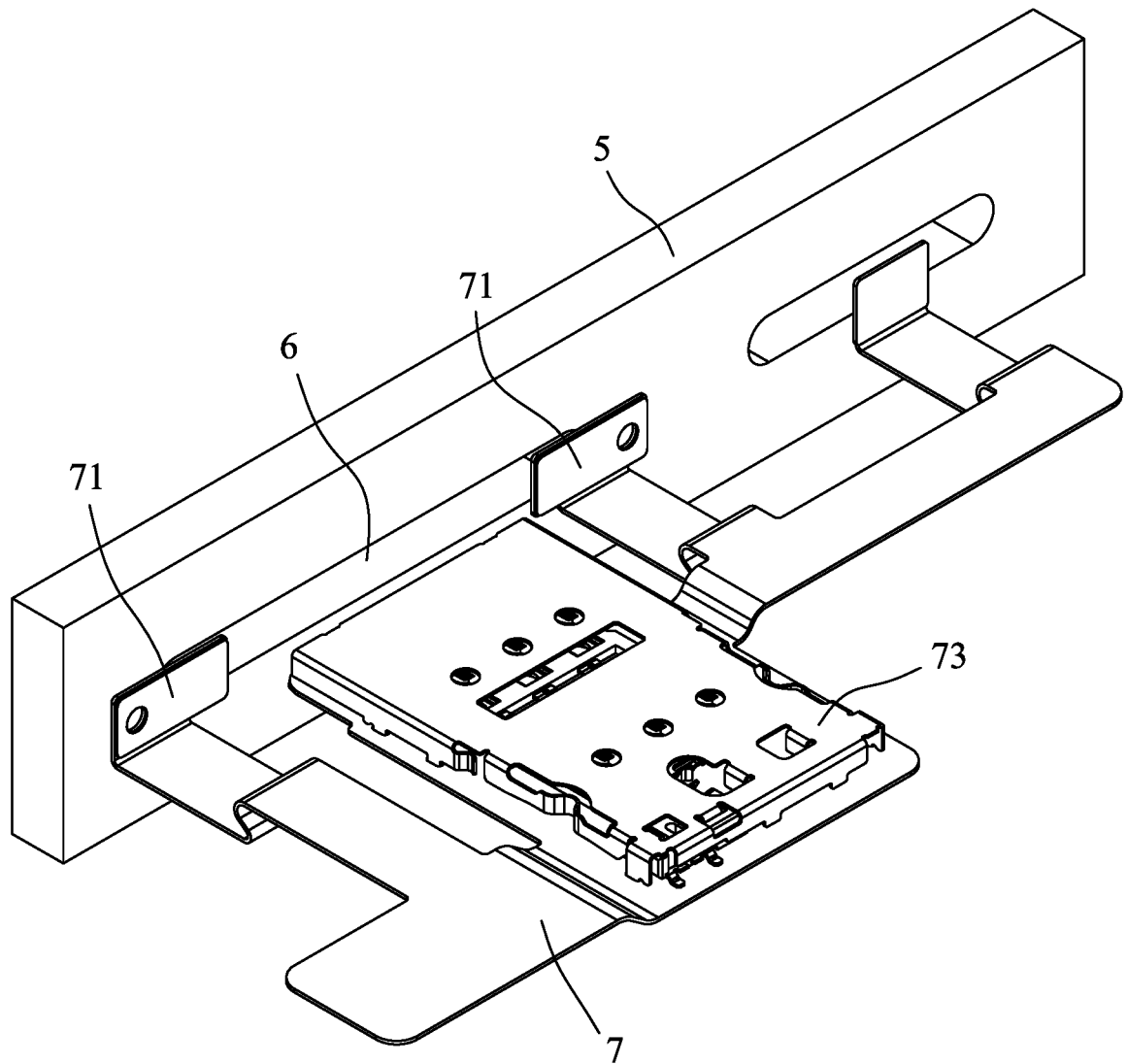
FIG. 5 is a perspective view of button assembly showing internal components in a card slot configured on a side wall of the communication equipment.
Figure 6:
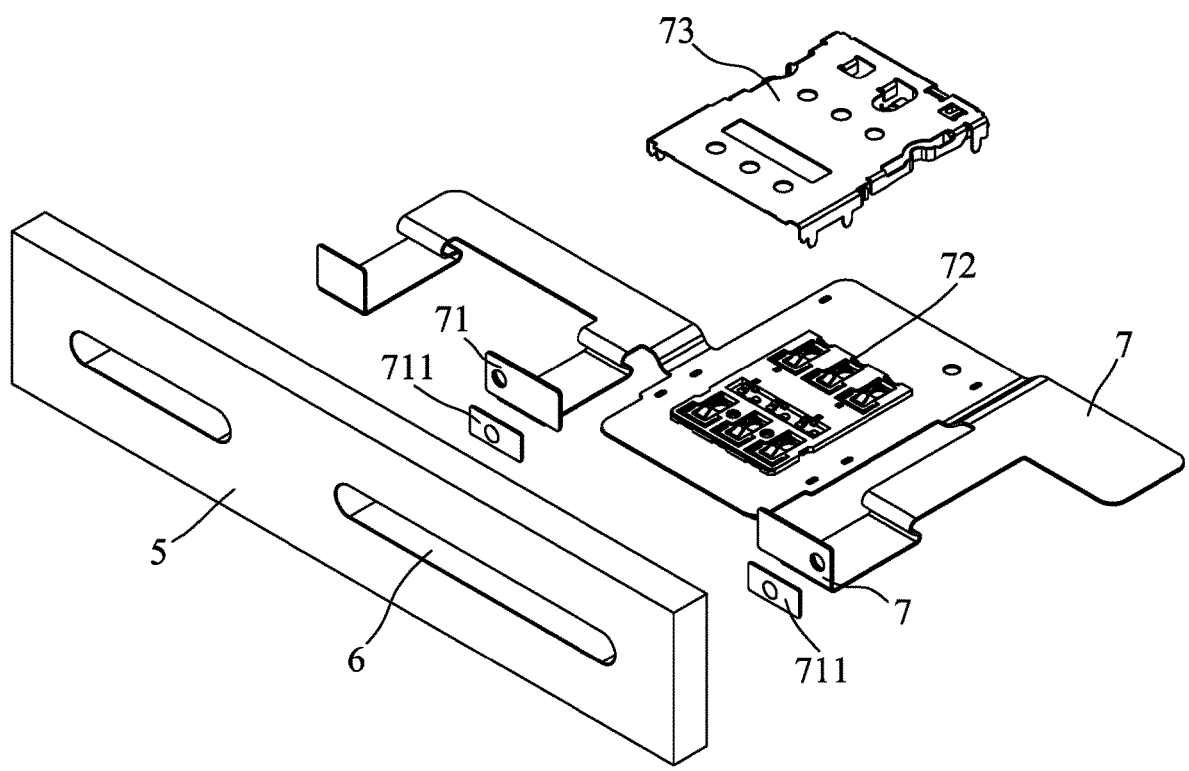
FIG. 6 is an exploded perspective view of FIG. 5.

With reference to FIG. 5 and FIG. 6, the button assembly 100 of the present invention is configured in a card slot 6 located on a side wall 5 of a communication equipment. An inside of the card slot 6 is equipped with a circuit board 7. The circuit board 7 is extended upward to form two extension parts 71. Each of the two extension parts 71 has a press piece 711. The two press pieces 711 are disposed corresponding to two ends of the button 1, respectively. The two press pieces 711 respectively function as increasing and decreasing volume of the communication equipment. The circuit board 7 is equipped with a set of terminals 72. The set of terminals 72 is disposed between the two extension parts 71. An iron shell 73 is mounted on the circuit board 7 to cover the set of terminals 72.

Figure 4:
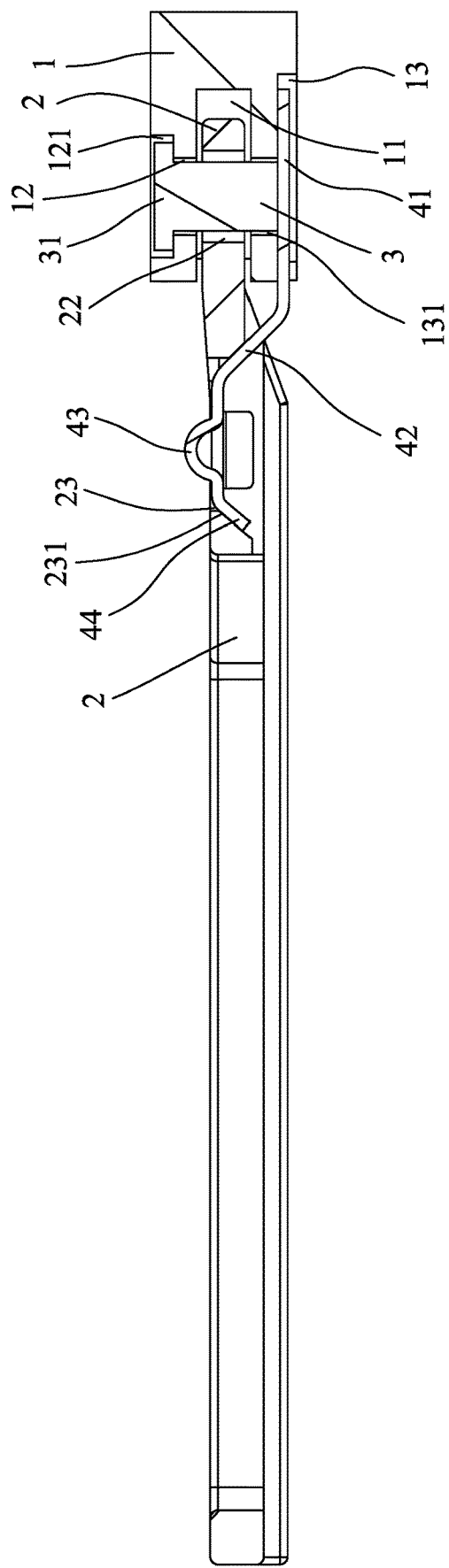
FIG. 4 is a cross-sectional view taken along lines IV-IV of FIG. 1.
Figure 7:
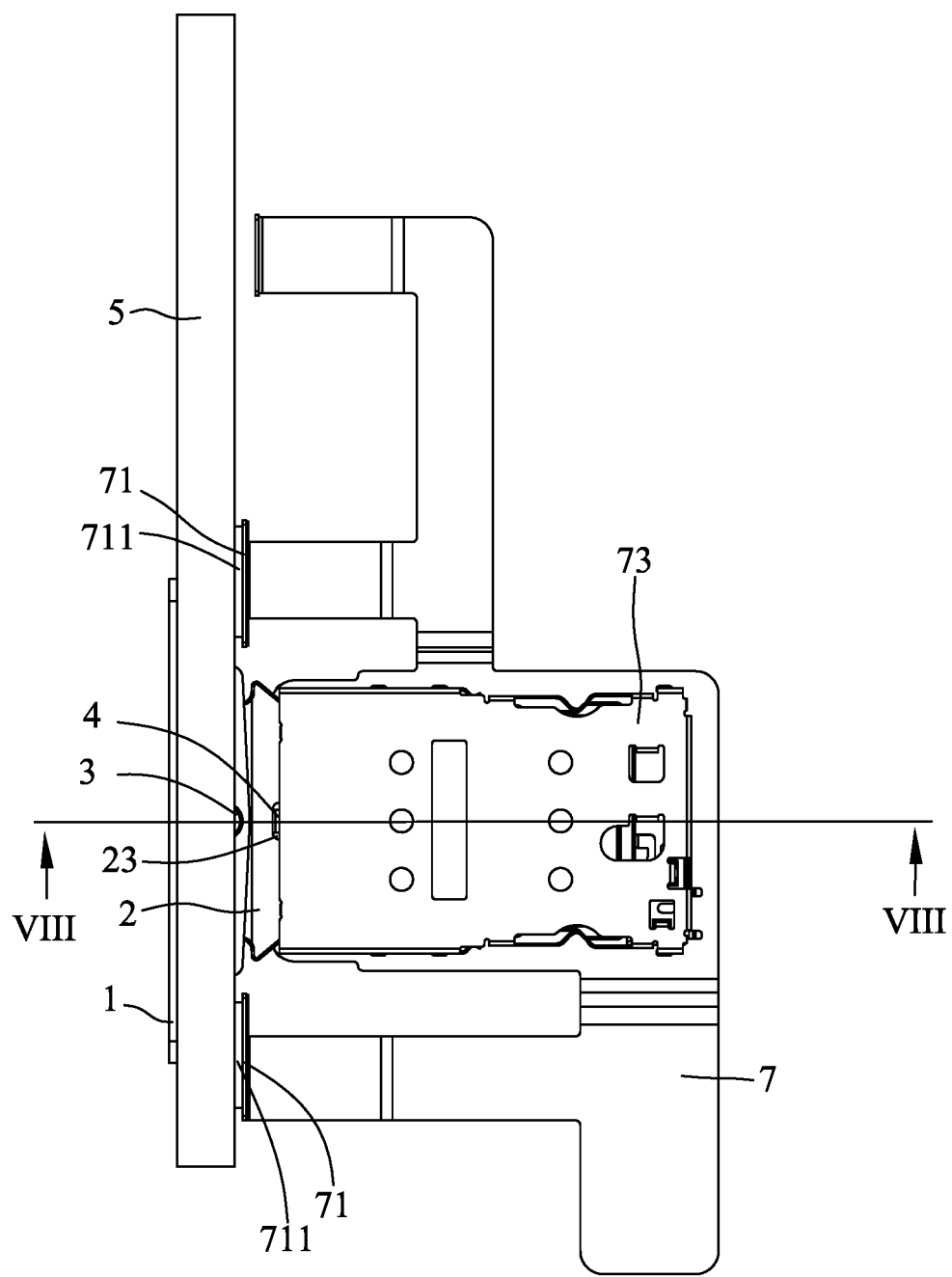
FIG. 7 is a perspective view of button assembly showing internal components in a card slot configured on a side wall of the communication equipment from another angle.
Figure 8:
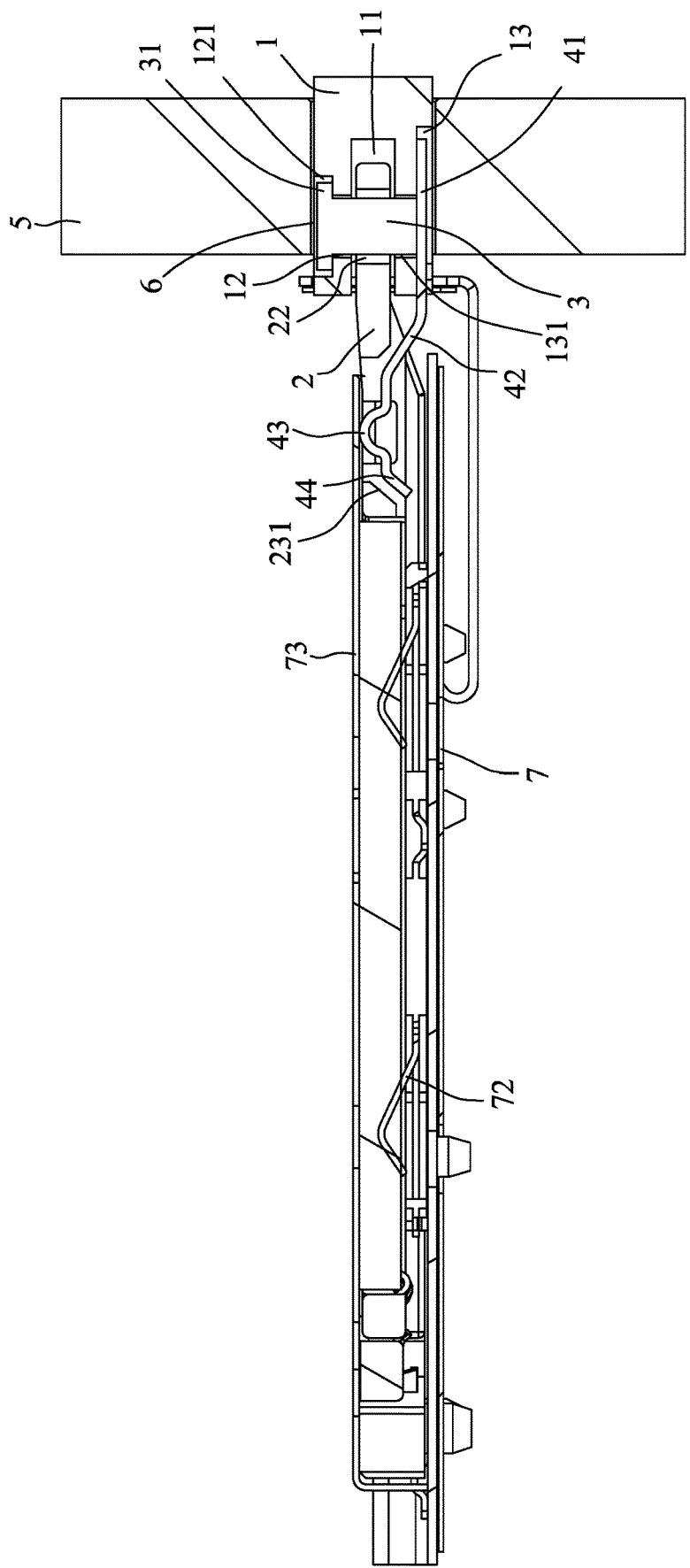
FIG. 8 is a cross-sectional view taken along lines VIII-VIII of FIG. 7.

With reference to FIG. 4, FIG. 7 and FIG. 8, when the button assembly 100 of the present invention is configured in the communication equipment, the elastic arm 4 is assembled in the iron shell 73. The two ends of the button 1 are respectively abutted against the two press pieces 711, which allows a user to press any end of the button 1 equivalent to push the corresponding press piece 711 for a function of increasing or decreasing volume of the communication equipment. With a limitation of an inner wall of the iron shell 73, the bump 43 is push downward to drive the elastic bar 42 to curve downward and store energy of a rebound force, and the locking block 44 is disengaged from the locking groove 231 for the loosening of the tray 2 from the button 1. When the user presses any end of the button 1, the button 1 has a rotational displacement with the fixing member 3 as a central axis. A gap between the holding space 11 and the base 21 provides room for the rotational displacement of the button 1 without moving the tray 2, so that the tray 2 can keep a fixed position in the iron shell 73.

When the button assembly 100 is ejected from the communication equipment, the energy of the rebound force stored by the elastic bar 42 is released to bring the bump 43 and the locking block 44 back to their initial positions, which makes the bump 43 reinstalled over the locking hole 23 and the locking block 44 re-abutted against the locking groove 231, so that the button 1 and the tray 2 are fixed with each other again.

As above, the locking hole 23 and the elastic arm 4 are disposed to form the button assembly 100 which provides the button 1 and the tray 2 are fixed or disengaged. The button 1 and the tray 2 are fixed to each other before configured in the communication equipment and are disengaged from each other after configured in the communication equipment. When the user presses the button 1 for adjusting volume, the button 1 is displaced and the tray 2 can avoid being influenced by the rotational displacement of the button 1 and can keep a fixed position in the communication equipment. Therefore, a combination of the button 1 and the tray 2 achieves an effect of saving space in assembling of internal components of the communication equipment.

What is claimed is:

1. A button assembly, configured in a communication equipment, wherein the button assembly includes a button, a tray and at least an elastic arm, a surface of the button is recessed to form a holding groove, the tray is combined with the button and is disposed with a locking hole, the locking hole has a locking groove, the locking groove is formed in a recess of the locking hole, the elastic arm is assembled on the button and has a pedestal arranged in the holding groove, the pedestal is protruded outward to form an elastic bar, a free end of the elastic bar forms a bump arranged corresponding to the locking hole, an outer edge of the free end of the elastic bar forms a locking block arranged corresponding to the locking groove, when the bump is mounted in the locking hole, the locking block is abutted against the locking groove, when the button assembly is configured in the communication equipment, the bump is push downward to make the locking block disengaged from the locking groove to loosen the tray from the button.

2. The button assembly of claim 1, wherein a side of the button is recessed inward to form a holding space, a side of the tray is protruded to form a base, the base is disposed in the holding space.

3. The button assembly of claim 2, wherein a surface of the button has at least a first positioning opening communicated with the holding space, the holding groove has at least a second positioning opening penetrating through and connecting to the holding space, the second positioning opening is arranged corresponding to the first positioning opening, the base has at least a third positioning opening arranged corresponding to the first positioning opening.

4. The button assembly of claim 3, wherein the first positioning opening is recessed to form an upper limit groove, the button assembly further includes at least a fixing member, the fixing member is disposed corresponding to the first positioning opening, an end of the fixing member has a fixing cap, the fixing member penetrates the first positioning opening, the third positioning opening and the second positioning opening, the fixing cap of the fixing member are placed in the upper limit groove, the pedestal is contacted with the fixing member and is fixed with the fixing member by means of spot welding or riveting pressure.

* * * * *